US009852801B1

(12) United States Patent
Coignus et al.

(10) Patent No.: US 9,852,801 B1
(45) Date of Patent: Dec. 26, 2017

(54) METHOD FOR DETERMINING A LEAKAGE CURRENT THROUGH AN INTER-GATE DIELECTRIC STRUCTURE OF A FLASH MEMORY CELL

(71) Applicant: COMMISSARIAT A L'ENERGIE ATOMIQUE ET AUX ENERGIES ALTERNATIVES, Paris (FR)

(72) Inventors: Jean Coignus, Grenoble (FR); Adam Dobri, Port Hope (CA); Simon Jeannot, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/366,662

(22) Filed: Dec. 1, 2016

(51) Int. Cl.
    *G11C 16/10* (2006.01)
    *G11C 16/34* (2006.01)
    *G11C 16/04* (2006.01)
    *G11C 16/12* (2006.01)

(52) U.S. Cl.
    CPC .......... *G11C 16/34* (2013.01); *G11C 16/0408* (2013.01); *G11C 16/12* (2013.01)

(58) Field of Classification Search
    CPC .................. G11C 16/10; G11C 16/26
    USPC ........................ 365/185.28, 185.24
    See application file for complete search history.

(56) References Cited

U.S. PATENT DOCUMENTS

| 5,198,380 | A | * | 3/1993 | Harari | G11C 11/5621 257/E21.209 |
| 5,268,870 | A | * | 12/1993 | Harari | G11C 11/5621 257/E21.209 |
| 5,477,499 | A | * | 12/1995 | Van Buskirk | G11C 16/16 185/2 |
| 5,510,638 | A | * | 4/1996 | Lancaster | G11C 16/0466 257/314 |
| 5,604,699 | A | * | 2/1997 | Cappelletti | G11C 29/50 365/185.19 |

(Continued)

OTHER PUBLICATIONS

De Salvo, B., et al., "Investigation of low field and high temperature $SiO_2$ and ONO leakage currents using the floating gate technique," Journal of Non-Crystalline Solids, vol. 245, 1999, pp. 104-109.

(Continued)

*Primary Examiner* — Michael Tran
(74) *Attorney, Agent, or Firm* — Pillsbury Winthrop Shaw Pittman LLP (57) ABSTRACT

A method for determining a leakage current through an inter-gate dielectric structure of a flash memory cell, the flash memory cell including a substrate including a channel region; a floating gate positioned above the channel region and separated from the channel region by a tunnel dielectric layer; a control gate positioned above the floating gate and separated from the floating gate electrode by the inter-gate dielectric structure; the method including programming the flash memory cell into an initial programmed state and applying biasing conditions to the programmed flash memory cell so as to obtain a zero electric field in the tunnel dielectric layer; measuring over time a change in a threshold voltage of the flash memory cell; and determining the leakage current from the change in the threshold voltage.

8 Claims, 4 Drawing Sheets

(56) References Cited

U.S. PATENT DOCUMENTS

| | | | | |
|---|---|---|---|---|
| 5,617,357 | A * | 4/1997 | Haddad | G11C 16/14 257/E29.306 |
| 5,774,400 | A * | 6/1998 | Lancaster | G11C 16/14 365/185.18 |
| 5,824,584 | A * | 10/1998 | Chen | H01L 27/105 257/E21.645 |
| 6,331,724 | B1 * | 12/2001 | Chen | H01L 27/105 257/365 |
| 6,894,517 | B2 * | 5/2005 | Kang | G11C 29/006 324/762.05 |
| 7,019,545 | B2 * | 3/2006 | Kang | G01R 31/2831 324/548 |
| 7,859,904 | B1 * | 12/2010 | Jenne | G11C 16/0466 365/185.18 |
| 8,063,434 | B1 * | 11/2011 | Polishchuk | H01L 21/0214 257/324 |
| 8,185,802 | B2 * | 5/2012 | Noguchi | G06F 11/1068 365/185.09 |
| 8,319,274 | B2 * | 11/2012 | Hisamoto | G11C 16/0425 257/314 |
| 8,467,231 | B2 * | 6/2013 | Matsuzaki | G11C 11/405 365/149 |
| 8,576,633 | B2 * | 11/2013 | Prabhakar | G11C 16/16 365/185.02 |
| 8,659,071 | B2 * | 2/2014 | Tian | H01L 29/792 257/324 |
| 8,664,652 | B2 * | 3/2014 | Yamazaki | H01L 29/42384 257/327 |
| 2002/0066933 | A1 * | 6/2002 | Tsu-Jae | B82Y 10/00 257/410 |
| 2013/0020477 | A1 * | 1/2013 | Castellan | G01J 1/44 250/252.1 |

OTHER PUBLICATIONS

Tao, G., et al., "Experimental study of carrier transport in multi-layered structures," Microelectronics Reliability, vol. 47, 2007, pp. 610-614.

Dobri, A., et al., "Oxide Stress Separation technique for the assessment of Inter-Gate Dielectric integrity in 40 nm Flash memory cells," Association Nationale de la Recherche et de la Technologie, 46$^{th}$ IEEE Semiconductor Interface Specialists Conference, Dec. 2015, 1 page.

Dobri, A., et al., "Oxide Stress Separation technique for the assessment of Inter-Gate Dielectric integrity in 40 nm Flash memory cells," Association Nationale de la Recherche et de la Technologie, 46$^{th}$ IEEE Semiconductor Interface Specialists Conference, Dec. 2015, 2 pages.

Wang, B., et al., "Measurement of Ultralow Gate Tunneling Currents Using Floating-Gate Integrator Technique," IEEE Electron Device Letters, vol. 26, No. 5, May 2005, pp. 329-331.

* cited by examiner

METHOD FOR DETERMINING A LEAKAGE CURRENT THROUGH AN INTER-GATE DIELECTRIC STRUCTURE OF A FLASH MEMORY CELL

FIELD

The present invention relates to a method for determining a low-field leakage current through the inter-gate dielectric structure of a flash memory cell, for example through the Oxide-Nitride-Oxide (ONO) structure disposed between the floating gate and the control gate of the flash memory cell.

BACKGROUND

Flash memory devices are widely adopted in personal computers and electronic apparatuses, since they can be written, read and erased many times and are capable of retaining data when disconnected from electric power. Unlike electrically erasable programmable read-only memory (EEPROM) from which it derives, flash memory is typically erased in fixed multi-bytes blocks, called sectors or pages. This type of non-volatile memory combines the advantages of EPROM (i.e. erasable programmable read-only memory) in terms of costs and density with the advantages of EEPROM in terms of functionality (electrical erase).

Conventional flash memories are comprised of a cell array, wherein each cell stores a single bit of data. A flash memory cell typically includes a metal oxide semiconductor (MOS) transistor having a source, a drain, and a channel in a substrate, as well as a stacked gate structure overlying the channel. The stacked gate structure comprises a thin gate dielectric layer (sometimes referred to as a tunnel oxide) arranged on the surface of the substrate, a polysilicon floating gate overlying the tunnel oxide, an inter-gate dielectric structure overlying the floating gate, and lastly, a polysilicon control gate overlying the inter-gate dielectric structure. The inter-gate dielectric structure between the control gate and the floating gate is often a multilayer stack such as the Oxide-Nitride-Oxide (ONO) stack. The ONO stack is comprised of two oxide layers sandwiching a nitride layer.

Such a flash memory cell may be written, or programmed, by applying a high positive voltage to the control gate and a more moderate voltage to the drain of the floating gate transistor. These voltages cause the passage of very high energy electrons (referred to as "hot electrons") from the channel to the floating gate. The electrons are then trapped in the floating gate and cause an increase in the threshold voltage of the transistor.

In order to erase the flash memory cell, a high negative voltage may be applied to the control gate while the drain is connected to the ground (zero voltage). Under these conditions, the electrons trapped in the floating gate are evacuated, via a tunnel effect through the gate oxide. The threshold voltage of the transistor is thus lowered and the memory cell returns to its erased state.

Leakage currents occurring in flash memory cells are critical for the data retention. As memory cells are scaled down, fewer electrons (<1000) are stored in the floating gate and more aggressively scaled ONOs are required for ensuring the coupling between the two gate electrodes. However, as the ONO structure is made physically thinner, its leakage current becomes more important to study. It is therefore of the utmost importance to be able to measure the leakage current through the ONO for the development of future flash memories at advanced technology nodes.

Given the thickness and quality of the ONO, it is not possible to measure directly the leakage currents at the electric field relevant to the data retention conditions (1-4 MV/cm). The leakage current is indeed too small, even for large area devices. Indirect measurement techniques must be used.

The floating gate technique, for example discussed in the document ["Investigation of low field and high temperature $SiO_2$ and ONO leakage currents using the floating gate technique", De Salvo B et al., Journal of Non-Crystalline Solids 245, pp. 104-109, 1999] has been used to measure low-field leakage currents through ONO in dedicated test structure, i.e. a capacitor comprising an ONO dielectric stack, and not 4843-6901-7917M in a flash memory cell. In addition to the fact that such a test structure has a much larger area than the flash memory cell (10 000 $\mu m^2$ instead of 60×100 $nm^2$), some effects occurring in flash memory cell, like ONO thickness variation on the edge of the cell, are not considered when using a dedicated test structure.

In the document ["Experimental study of carrier transport in multi-layered structures", Tao G et al., Microelectronics Reliability 47, pp. 610-614, 2007], flash cells themselves have been used to measure charge redistribution in the nitride layer of the ONO stack. This charge redistribution causes a shift of the threshold voltage ($V_1$) of the memory cell and thus may also cause data retention problems. However, this phenomenon is distinct from the leakage through the ONO of the charges stored in the floating gate.

SUMMARY

There is therefore a need to provide a technique for the characterization of inter-gate dielectric leakage current that bypasses the detection limits of large-area test structures and works on nominal flash memory cells.

According to a first aspect of the invention, this need is satisfied by providing a method for determining a leakage current through an inter-gate dielectric structure of a flash memory cell, the flash memory cell comprising:
  a substrate comprising a channel region;
  a floating gate positioned above the channel region and separated from the channel region by a tunnel dielectric layer; and
  a control gate positioned above the floating gate and separated from the floating gate electrode by the inter-gate dielectric structure;
the method comprising the following steps:
  programming the flash memory cell into an initial programmed state and applying biasing conditions to the programmed flash memory cell so as to obtain a zero electric field in the tunnel dielectric layer;
  measuring over time a change in a threshold voltage of the flash memory cell; and
  determining the leakage current from the change in the threshold voltage.

In one or more embodiments, the method comprises the following steps:
  determining a flat-band voltage of a tunnel capacitor comprising the channel region, the tunnel dielectric layer and the floating gate, the flat-band voltage implying the zero electric field in the tunnel dielectric layer;
  determining the initial programmed state and a corresponding control gate bias that lead to a voltage between the floating gate and the channel region equal to the determined flat-band voltage, given a desired electric field in the inter-gate dielectric structure;

programming the flash memory cell in the initial programmed state;

applying the corresponding control gate bias and read intermittently the programmed flash memory cell so as to obtain a plurality of threshold voltage values of the flash memory cell;

determining the leakage current from the plurality of threshold voltage values.

The method according to the first aspect of the invention may also have one or more of the following characteristics, considered individually or according to any technically possible combinations thereof:

the flat-band voltage of the tunnel capacitor is determined from a C-V measurement of a capacitive test structure of identical construction but larger area than the tunnel capacitor;

the initial programmed state of the flash memory cell and the corresponding control gate bias are determined by solving the following equations:

$$V_t^{OSS} = V_{CG}^{OSS} + V_{t_0} - \frac{V_{FB}}{\alpha_{CG}}$$

$$V_{CG}^{OSS} = E_{ONO} \times EOT_{ONO} + V_{FB}$$

where $E_{ONO}$ is the desired electric field in the inter-gate dielectric structure, $V_{FB}$ is the determined flat-band voltage, $EOT_{ONO}$ is an equivalent oxide thickness of the inter-gate dielectric structure, $V_{t_0}$ is a neutral threshold voltage of the flash memory cell, when the floating gate is empty of charge, and $\alpha_{CG}$ is a coupling factor between the control gate and the floating gate;

the method further comprising a step of determining the neutral threshold voltage and the coupling factor from a drain current-control gate potential measurement of the flash memory cell and from a drain current-gate potential measurement of a transistor equivalent to the flash memory cell;

the transistor equivalent to the flash memory cell is comprised of a test memory cell, of identical geometry to the flash memory cell, having a floating gate and a control gate in short-circuit;

the leakage current is determined by fitting the plurality of threshold voltage values with the following relationship:

$$V_t(t) = A_0 * e^{-t/\tau} + A_1 + A_2 * t$$

where $A_0, A_1, A_2$ are fitting constants, is a charge trapped-related factor and t is a time during which the control gate bias is applied.

A second aspect of the invention relates to a non-transitory machine readable medium (e.g. a memory) comprising a computer program product comprising instructions for implementing the method according to the first aspect of the invention, when executed by a processor.

BRIEF DESCRIPTION OF THE FIGURES

Other characteristics and benefits of the invention will become clear from the description that is given thereof below, by way of indication and in no way limiting, with reference to the appended figures, among which.

For greater clarity, identical or similar elements are marked by identical reference signs in all of the figures.

DETAILED DESCRIPTION

Figure 1:
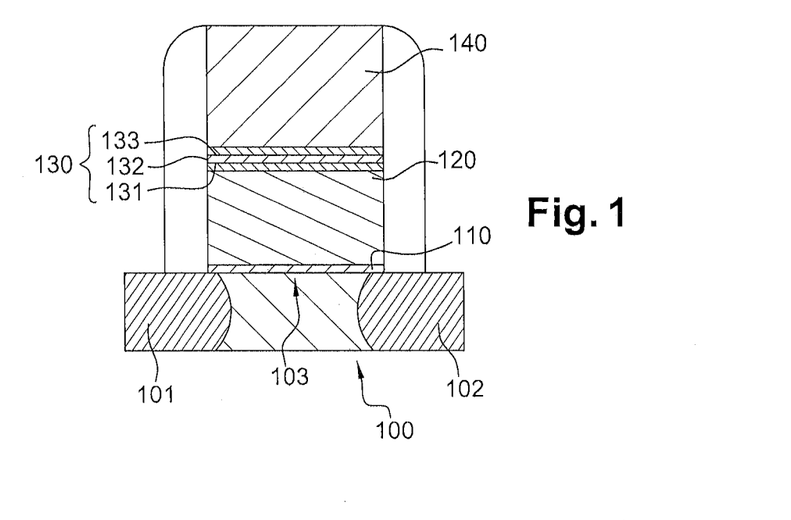
FIG. 1 is a sectional view of a conventional flash memory cell.

FIG. 1 schematically represents a conventional flash memory cell 10. The flash memory cell 10 comprises a semiconductor substrate 100 having a source region 101, a drain region 102 and a channel region 103 positioned between the source region 101 and drain region 102. The semiconductor substrate 100 is for example made of silicon. In an embodiment, the channel region 103 of the substrate is p-type doped whereas its drain and source regions 101-102 are n-type doped.

The memory cell 10 further comprises a stacked gate structure formed on the silicon substrate 100. This stacked gate structure successively comprises a tunnel dielectric layer 110, a floating gate 120, an inter-gate dielectric structure 130 and a control gate 140. The tunnel dielectric layer 110 overlies the channel region 103 and separates the floating gate 120 from the substrate 100. The tunnel dielectric layer 110 is for example made of silicon oxide or of a high-K dielectric material, such as hafnium oxide or zirconium oxide. The floating gate 120 and the control gate 140 may be both layers of doped polysilicon or of metal. Alternatively, the floating gate 120 and the control gate 140 may comprise a polysilicon layer and a metal layer.

The flash memory cell 10 is thus constructed as a metal-oxide semiconductor field effect transistor (MOSFET) with an additional floating gate arranged between the control gate and the tunnel dielectric layer. This transistor is named thereafter "floating gate transistor".

The inter-gate dielectric structure 130 separates the control gate 140 from the floating gate 120. In an embodiment, the inter-gate dielectric structure 130 is a multilayer stack, such as the Oxide-Nitride-Oxide (ONO) stack. The ONO stack typically comprises a bottom silicon oxide layer 131, an intermediate silicon nitride layer 132 and a top silicon oxide layer 133.

Programming, i.e. writing, of the memory cell 10 is done by applying the appropriate potentials to the electrodes of the floating gate transistor, i.e. the control gate 140, the substrate or "body" 100 and the source and drain regions 101-102, so that electrons of the channel region 103 are transferred to the floating gate 120 through the tunnel oxide layer 110, The addition of electrons to the floating gate 120 increases the threshold voltage $V_t$ of the floating gate transistor above the neutral threshold voltage $V_{t_0}$, i.e. the value of the threshold voltage $V_t$ for an uncharged floating gate. Two techniques may be used for electron transfer across the tunnel oxide layer 110: hot electron injection and Fowler-Nordheim tunneling.

On the contrary, the erasure of the memory cell 10 is carried out by applying potentials to the electrodes of the floating gate transistor so that electrons are removed from the floating gate (by Fowler-Nordheim tunneling), thus lowering the threshold voltage $V_t$.

Figure 2A:
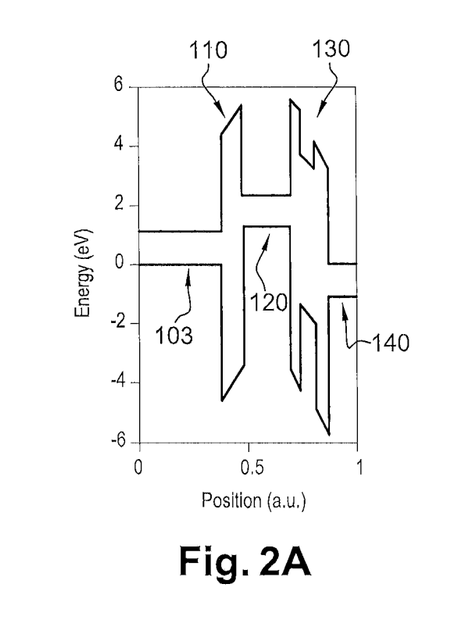
FIGS. 2A and 2B show respectively the band diagram and the electric field of the flash memory cell, after program, when data retention conditions are applied to the flash memory cell.

FIG. 2A shows a band diagram of the memory cell 10 once programmed, when data retention conditions are applied to the electrodes of the floating gate transistor. Typical data retention conditions include a zero control gate potential $V_{CG}$, a zero source potential $V_S$, a zero drain potential $V_D$ and a zero substrate (or body) potential $V_B$ ($V_{CG}=V_S=V_D=V_B=0$).

Figure 2B:
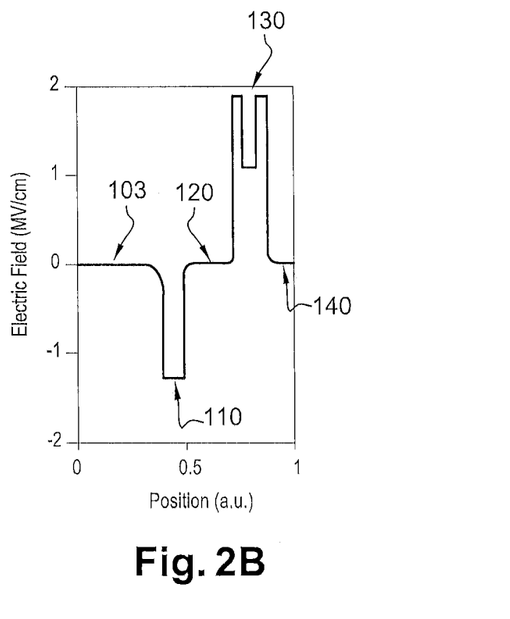

The floating gate 120 being filed with electrons, it has a higher energy level than the control gate 140 and the channel region 103. This high energy level causes electric fields across the tunnel oxide layer 110 and across the ONO stack 130 that have different polarities, as shown on FIG. 2B. Therefore, an electron in the floating gate 120 can either escape through the tunnel oxide 110 towards the channel region 103 or through the ONO 130 towards the control gate 140. The higher the number of electrons in the floating gate is, the higher the electric fields in the tunnel oxide and in the ONO are.

In such data retention conditions, as well as in most cases where a control gate potential $V_{cc}$ is applied to the flash cell, a potential drop occurs both across the tunnel oxide layer 110 and the ONO stack 130. Therefore, the effects related to the tunnel layer and the ONO, like leakage currents of the memory flash, cannot be easily decorrelated.

The principle of the method for measuring the inter-gate structure leakage current according to the first aspect of the invention is that the stress in the inter-gate structure (e.g. ONO) and the stress in the dielectric tunnel (e.g. tunnel oxide) layer are separated during the measurement, by finding and applying conditions to the memory cell such that the electric field in the tunnel layer falls to zero. Thus, leakage current in the memory cell will be solely attributable to the inter-gate structure.

Figure 3A:
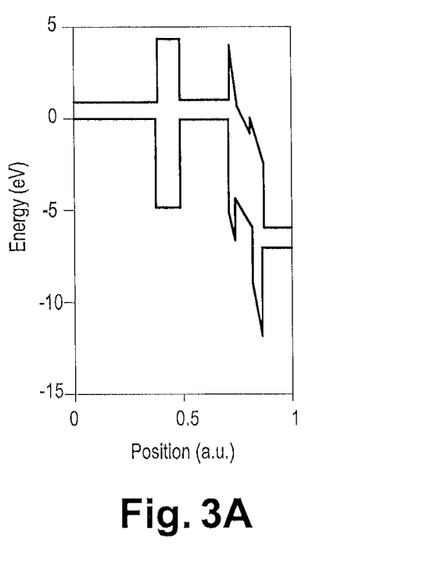
FIGS. 3A and 3B show respectively the band diagram and the electric field of the flash memory cell in the conditions required for measuring the inter-gate leakage current, according to an aspect of the invention.
Figure 3B:
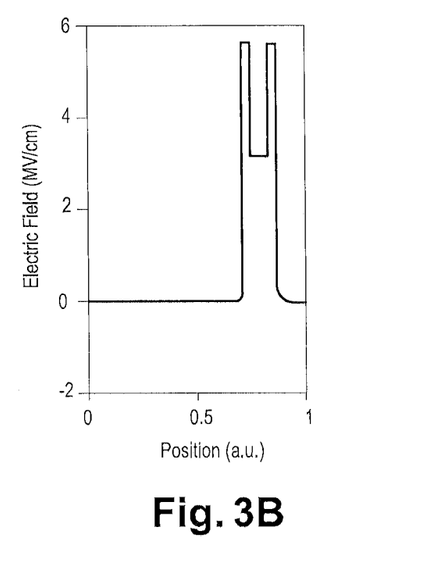

As shown on FIGS. 3A and 3B, a zero electric field in the tunnel oxide layer 110 can be achieved by putting the channel 103/tunnel oxide layer 110/floating gate 120 stack in flat-band conditions. In this configuration, the potential drop in the memory cell 10 occurs entirely across the ONO stack 130 (cf. FIG. 3A; $V_{CG}$=6 V). Then, the charge loss across the ONO stack 130 is determined, indirectly, by measuring the change in the threshold voltage $V_t$ of the floating gate transistor.

The channel 103/tunnel oxide layer 110/floating gate 120 stack form a MOS capacitor, referred to as "tunnel capacitor". The flat-band conditions are obtained by applying a voltage between the floating gate 120 and the channel region 103 equal to the flat-band voltage $V_{FB}$ of the tunnel capacitor. For example, if the body potential $V_B$ is zero, the floating gate potential $V_{FG}$ is brought to the flat-band voltage $V_{FB}$.

Figure 4:
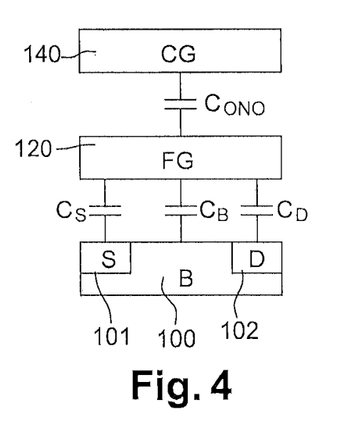
FIG. 4 shows an electric circuit equivalent to the flash memory cell according to FIG. 1.

FIG. 4 shows the equivalent electric circuit of the flash cell 10 comprising the floating gate 120 coupled to the control gate 140, as well as the body (100), source (101) and drain (102) electrodes. Equation (1) below describes the floating gate potential $V_{FG}$ while the average electric fields in tunnel oxide 110 and the ONO stack 130, $E_{tun}$ and $E_{ONO}$ respectively, are given by equations (2) and (3):

$$V_{FG}=\alpha_{CG}(V_{CG}V_{t_0}-V_t)+\alpha_B V_B+\alpha_S V_S+\alpha_D V_D \quad (1)$$

$$E_{tun} = \frac{\Delta V_{tun}}{EOT_{tun}} = \frac{(V_{FG} - V_{FB})}{EOT_{tun}} \quad (2)$$

$$E_{ONO} = \frac{\Delta V_{ONO}}{EOT_{ONO}} = \frac{(V_{CG} - V_{FG})}{EOT_{ONO}} \quad (3)$$

where:
- $V_{CG}$, $V_B$, $V_S$, $V_D$ are the potentials applied to the control gate 140, the body 100, the source 101 and the drain 102, respectively;
- $\alpha_{CG}$, $\alpha_B$, $\alpha_S$, $\alpha_D$ are the coupling factors between the control gate 140 and the floating gate 120, between the floating gate 120 and the body 100, between the floating gate 120 and the source 101 and between the floating gate 120 and the drain 103, respectively ($\alpha_i=C_i/\Sigma C_i$ with $C_i$ being chosen among the ONO capacitance $C_{ONO}$, the body capacitance $C_B$, the source capacitance $C_S$ and the drain capacitance $C_D$);
- $V_{t_0}$ is the neutral threshold voltage (zero floating gate charge);
- $EOT_{tun}$ and $EOT_{ONO}$ are the equivalent oxide thickness of the tunnel oxide layer 110 and the ONO stack 130, respectively.

When considering a floating gate potential $V_{FG}$ equal to the flat-band voltage $V_{FB}$, as well as source, drain and body potentials equal to zero ($V_S=V_D=V_B=0$), equations (1) and (3) can be rewritten in the following form:

$$V_t = V_{CG} + V_{t_0} - \frac{V_{FB}}{\alpha_{CG}} \quad (1')$$

$$V_{CG}=E_{ONO}\times EOT_{ONO}+V_{FB} \quad (3')$$

Thus, the conditions of the memory cell required to obtain the above-mentioned oxide stress separation (OSS) include a value $V_t^{OSS}$ of the threshold voltage $V_t$ and a corresponding value $V_{CG}^{OSS}$ of the control gate potential $V_{CG}$ that satisfied the following equations (4) and (5):

$$V_t^{OSS} = V_{CG}^{OSS} + V_{t_0} - \frac{V_{FB}}{\alpha_{CG}} \quad (4)$$

$$V_{CG}=E_{ONO}\times EOT_{ONO}+V_{FB} \quad (5)$$

The threshold voltage value $V_t^{OSS}$ corresponds to an initial programmed state of the memory cell 10, i.e. a starting point for the measurement of the ONO leakage current. The control gate voltage value $V_{CG}^{OSS}$ defines the corresponding control gate bias to be applied afterwards in order to obtain the oxide stress separation.

Once the memory cell 10 is in the programmed state and the control gate bias $V_{CG}^{OSS}$ is applied, electrons in the floating gate 120 starts to leak through the ONO stack 130. Consequently, the threshold voltage $V_t$ decreases according to equation 7 below, where Q is the charge on the floating gate and $C_{ONO}$ the capacitance of the ONO:

$$V_t(t) = V_{t_0} - \frac{Q(t)}{C_{ONO}} \quad (7)$$

This change over time of the threshold voltage $V_t$, noted $dV_t/dt$, may then be used in equation (8) below to calculate a current I, one component of which is the leakage current through the ONO:

$$I = -C_{ONO}\frac{dV_t}{dt} \quad (8)$$

An embodiment of a method for measuring the inter-gate leakage current according to the invention will now be described by reference to the FIG. 5.

The method comprises a first step S1 of determining the flat-band voltage $V_{FB}$ of the tunnel capacitor, i.e. the stack comprising the channel region 103, the tunnel oxide layer 110 and the floating gate 120. Such flat-band voltage $V_{FB}$ cannot be measured directly on the memory cell, since there is no electrical access to the floating gate 120. Thus, in an embodiment of step S1, the flat-band voltage $V_{FB}$ of the tunnel capacitor is determined from a C-V (Capacitance vs. Voltage) measurement of an equivalent capacitive test structure. The flat-band voltage $V_{FB}$ is the voltage of the C-V curve which separates the accumulation regime from the depletion regime.

Figure 6A:
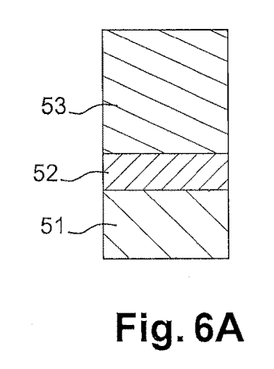
FIGS. 6A-6C schematically represent three test structures which may be used in the determining method of FIG. 5.

This first test structure, illustrated on FIG. 6A, consists in a MOS capacitor having the same construction than the tunnel capacitor. It comprises a first electrode 51 made of (p-type) doped silicon (like the substrate 100 of the memory cell 10), a silicon oxide layer 52 and a second electrode 53 made of doped polysilicon (like the floating gate 120). Thicknesses of the first silicon electrode 51, of the oxide layer 52 and of the second polysilicon electrode 53 in the capacitive test structure are the same as those of the substrate 100, the tunnel oxide layer 110 and the floating gate 120, respectively. Doping level are also the same.

The capacitive test structure of FIG. 6A has, in an embodiment, a larger area than that of the tunnel capacitor, for example 100 μm×100 μm. The C-V measurement can thus be carried out more easily with a greater precision.

In this embodiment, where the oxide stress separation conditions $V_t^{OSS}$ and $V_{CG}^{OSS}$ of the memory cell are determined numerically, the method further comprises a step S2 of determining the neutral threshold voltage $V_{t_0}$ and the coupling factor $\alpha_{CG}$ between the floating gate and the control gate of the memory cell. These parameters will be used in step S3 to solve equations (4) and (5) above.

The neutral threshold voltage $V_{t_0}$ and the coupling factor $\alpha_{CG}$ may be determined by using a transistor equivalent to the memory cell 10. This equivalent transistor, schematically represented on FIG. 6B, comprises a body B', a gate electrode G', a source electrode S' and a drain electrode D'. The equivalent transistor is configured such that its drain current $I_D'$ is equal to the drain current $I_D$ of the memory cell 10, when the gate electrode G' of the transistor is brought to a potential $V_G'$ equal to the floating gate potential $V_{FG}$ of the memory cell 10 and when the drain electrode D' of the transistor is at the same potential as the drain region 102 of the memory cell 10.

Figure 6B:
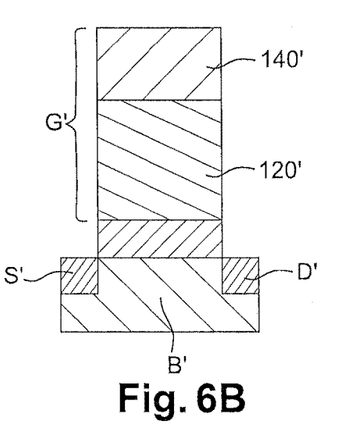

Firstly, the drain current $I_D$ of the memory cell 10 is measured as a function of, its control gate potential $V_{CG}$ and the drain current $I_D'$ of the equivalent transistor is measured as a function of its gate potential $V_G'$. During these measurements, the drain D' of the transistor is brought to the same potential as the drain region 102 of the memory cell 10 (for example 4 V). Source and body potentials of the memory cell 10 ($V_S$, $V_B$) and of the transistor ($V_S'$, $V_B'$) are, in an embodiment, zero ($V_S=V_B=V_S'=V_B'=0$). Two $I_D$-$V_G$ curves are thus obtained.

Then, knowing that the drain current $I_D$ of the memory cell 10 is equal to the drain current $I_D'$ of the transistor if and only if the gate potential $V_G'$ of the transistor is equal to the floating gate potential $V_{FG}$, the characteristic $V_{FG}(V_{CG})$ (i.e. the floating gate potential as a function of the control gate potential) can be obtained by combining the two $I_D$-$V_G$ curves.

Finally, the neutral threshold voltage $V_{t_0}$ and the coupling factor $\alpha_{CG}$ are derived from the $V_{FG}(V_{CG})$ characteristic. Indeed, the floating gate potential $V_{FG}$ and the control gate potential $V_{CG}$ are linked with the neutral threshold voltage $V_{t_0}$ and the coupling factor $\alpha_{CG}$ through equation (1).

The equivalent transistor, in an embodiment, consists in a test memory cell having a construction identical to the flash memory cell 10, except that the floating gate 120' and the control gate 140' of the test memory cell are in short-circuit. The floating gate 120' and the control gate 140' of the test memory cell form the gate electrode G' of the equivalent transistor.

The following step S3 consists in determining the pair of OSS conditions $V_t^{OSS}$ and $V_{CG}^{OSS}$ that minimizes the electric field in the tunnel oxide layer 110 and, for example, leads to a voltage of the floating gate 120 equal to the determined flat-band voltage ($V_{FG}=V_{FB}$ when $V_B=0$).

As previously explained, in an embodiment, this determination is carried out by solving equations (4) and (5) above. The electric field $E_{ONO}$ across the ONO stack, at which a measure of the leakage current is desired, is considered. For example, it may be sought to measure the ONO leakage current at 3 MV/cm, which is typical of the data retention conditions in flash memory cells. If unknown, the equivalent oxide thickness $EOT_{ONO}$ of the ONO is also determined, in an embodiment, by using a large area ONO capacitor. This ONO capacitor, shown on FIG. 6C, comprises a first electrode 61 made of doped polysilicon (like the floating gate 120 of the memory cell 10), an ONO stack 62 and a second electrode 63 made of doped polysilicon (like the control gate 140). Thicknesses of the first polysilicon electrode 61, of the ONO stack 62 and of the second polysilicon electrode 63 are the same as the floating gate 120, the ONO stack 130, and the control gate 140, respectively.

The neutral threshold voltage $V_{t_0}$ and the coupling factor $\alpha_{CG}$ being known (from step S2), as well as the ONO equivalent oxide thickness $EOT_{ONO}$ and electric field $E_{ONO}$, equations (4) and (5) form a system of equations of the first degree with only two unknowns. This system can be easily solved, for example by means of a computer.

Referring again to FIG. 5, step S4 of the method consists in programming the flash memory cell 10 in the initial state corresponding to the threshold voltage value $V_t^{OSS}$ determined at step S3. By doing so, a certain amount of electrons is stored in the floating gate 120 of the memory cell 10. Such a programming may be accomplished step-by-step. For example, a first programming pulse is applied to the control gate 140 of the memory cell 10 and then the memory cell is read to determine its threshold voltage $V_t$. If the threshold voltage $V_t$ found by reading the cell is lower than the target value $V_t^{OSS}$, an additional programming pulse is applied (and more electrons are stored in the floating gate). Programming pulses and read operations are thus reproduced until the threshold voltage value $V_t^{OSS}$ is reached. Reading of the flash memory cell may be carried out by applying a voltage ramp to the control gate while measuring the drain current $I_D$. The threshold voltage $V_t$ is then extracted from the $I_D(V_{CG})$ characteristics.

Figure 5:
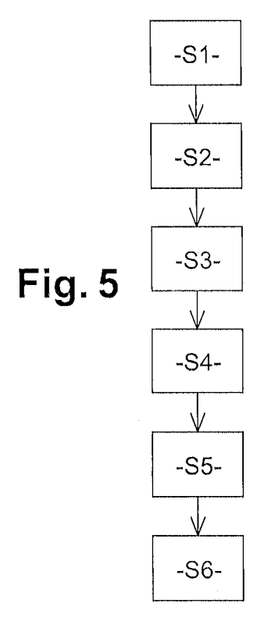
FIG. 5 is a flow chart depicting steps of a method for determining the inter-gate leakage current, according to an embodiment of the invention.

During step S5 of FIG. 5, the control gate potential $V_{CG}$ is brought to the control gate bias $V_{CG}^{OSS}$, which corresponds to the threshold voltage value $V_t^{OSS}$. The memory cell 10 is thus placed in oxide stress separation (OSS) conditions (i.e. zero electric field in the tunnel oxide; Etun=0). The control gate bias $V_{CG}^{OSS}$ is applied during a period of time long enough to let the electrons leak through the ONO stack. The control gate bias $V_{CG}^{OSS}$ is for example applied during 60 hours.

Figure 7:
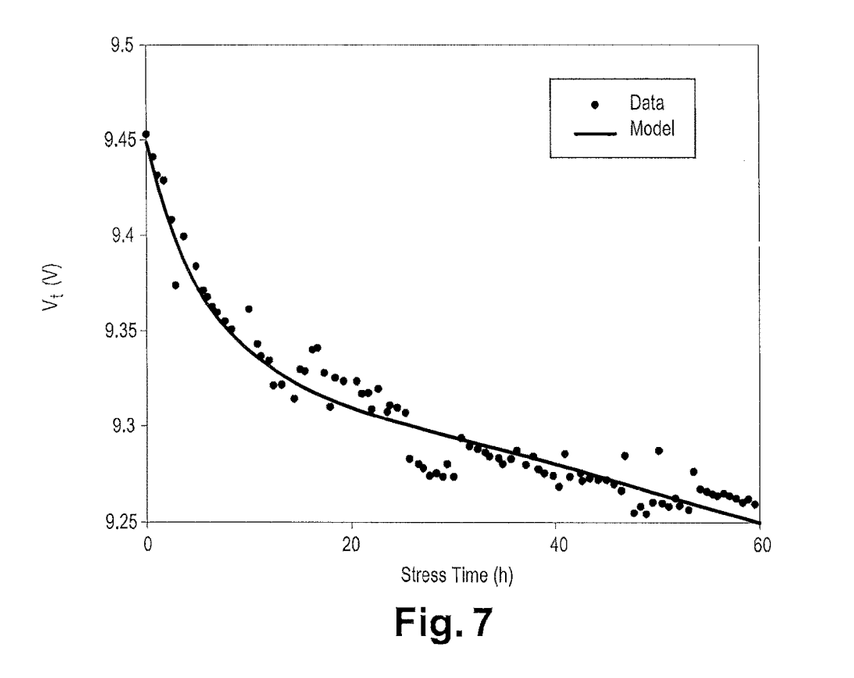
FIG. 7 represents the threshold voltage of the flash memory cell measured during the step S5 of the method.

Application of the control gate bias $V_{CG}^{OSS}$ is interrupted intermittently, for example each 30 minutes, to read the memory cell. Threshold voltage data $V_{t_i}$ are then obtained. FIG. 7 is an exemplary representation of the threshold voltage data $V_{t_i}$ measured at step S5 during application of the control gate bias $V_{CG}^{OSS}$.

Instead of applying a constant control gate potential ($V_{CG}=V_{CG}^{OSS}$), it is also possible to change the control gate potential $V_{CG}$ after each read measurement, in order to take account the shift of the threshold voltage $V_t(t)$ due to the charge leakage and maintain a zero electric field in the tunnel oxide.

The OSS measurement of step S5 is made at the same test temperature than that used for determining the flat band voltage $V_{FB}$, the neutral threshold voltage $V_{t_0}$ and the coupling factor $\alpha_{CG}$ (by means of the equivalent test structures). This test temperature is for example 250° C., a typical value for bake data-retention tests.

Finally, in step S6 of the method, the threshold voltage data $V_{t_i}$, constituting a $V_t(t)$ curve of the flash memory cell biased at the OSS conditions, are fit with the following model:

$$V_t(t) = A_0 * e^{-t/\tau} + A_1 + A_2 * t$$

where $A_0$, $A_1$, $A_2$ are fitting constants, $\tau$ is a factor related to the number of charges trapped in the tunnel oxide and/or in the spacers of the floating gate transistor and/or in the nitride/oxide layers of the ONO stack 130, and t is the stress (or measurement) time, i.e. the time during which the control gate bias $V_{CG}^{OSS}$ is applied (the duration of the read operation is neglected).

The exponential decay component of this model ($A_0 * e^{-t/\tau} + A_1$) arises from the rapid initial decay of the $V_t(t)$ curve. This initial exponential decay is due to detrapping of the charges trapped in the tunnel oxide and in the spacers at each side of the stacked gate structure or to the charge movement in the ONO. It may be also observed in the flash-equivalent transistor of FIG. 6B. The pre-exponential constant $A_0$ and the constant $A_1$ sum to the (initial) threshold voltage value $V_t^{OSS}$: $V_t(t=0) = V_t^{OSS}$. The linear component $A_2 * t$ represents the leakage current across the ONO, $I_{ONO}$. At each electric field $E_{ONO}$ is associated only one leakage current $I_{ONO}$.

Figure 6C:
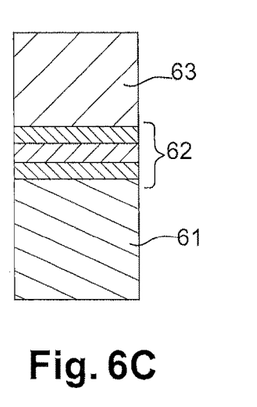

Fitting the threshold voltage data $V_{t_i}$ with the above-mentioned model enables to determine the slope of the linear component: the constant $A_2$. The ONO leakage current $I_{ONO}$ is derived from this constant $A_2$, as well as from the ONO capacitance $C_{ONO}$ (determinable from the ONO capacitor of FIG. 6C) by using the following equation (derived from equation (8) above):

$$I_{ONO} = -C_{ONO} \times A2$$

To achieve a good precision, the OSS measurement must be sufficiently long to insure that the $dV_t/dt$ component related to the tunnel oxide/spacer detrapping ($-t/\tau A_0 \times e^{-t/\tau}$) is minimized. For the exemplary measurement of FIG. 7, $A_0$ and $\tau$ are on the order of 200 mV and $10^4$ s, respectively. The $V_t$ shift related to the tunnel oxide/spacer detrapping is within the read measurement error (~10 mV) after approximately 8-9 hours.

The steps S2-S5 described above are beneficially repeated with other values of the ONO electric field $E_{ONO}$. New pairs of OSS conditions, $V_t^{OSS}$ and $V_{CG}^{OSS}$, are thus determined at step S2 and used for the OSS measurement of step S5. For example, FIG. 8 shows the $V_t$ shift relative to each initial threshold voltage value $V_t^{OSS}$ in function of the stress time t, for different $E_{ONO}$ values ranging between 3.2 MV/cm and 5 MV/cm.

Figure 8:
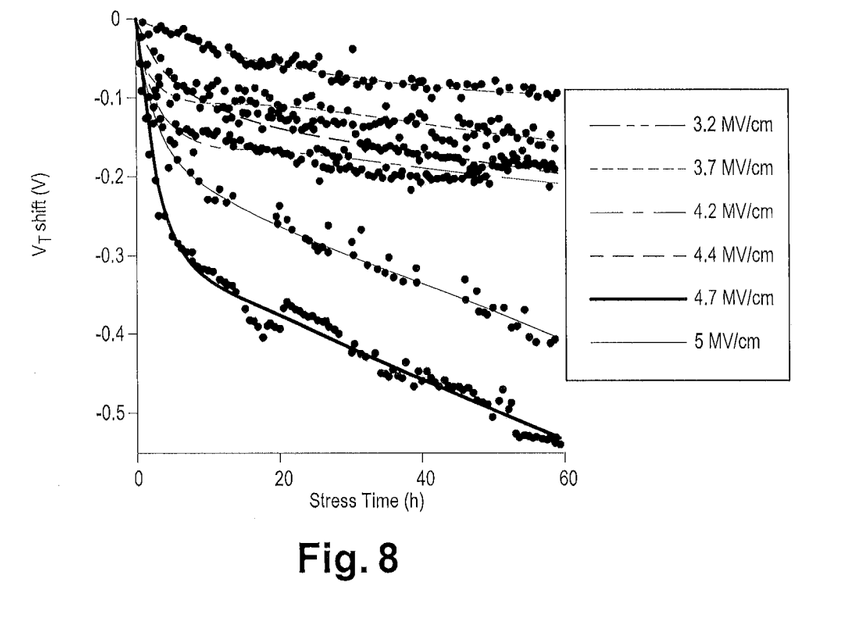
FIG. 8 shows several threshold voltage shift measured for different electric field in the inter-gate structure of the flash memory cell.
Figure 9:
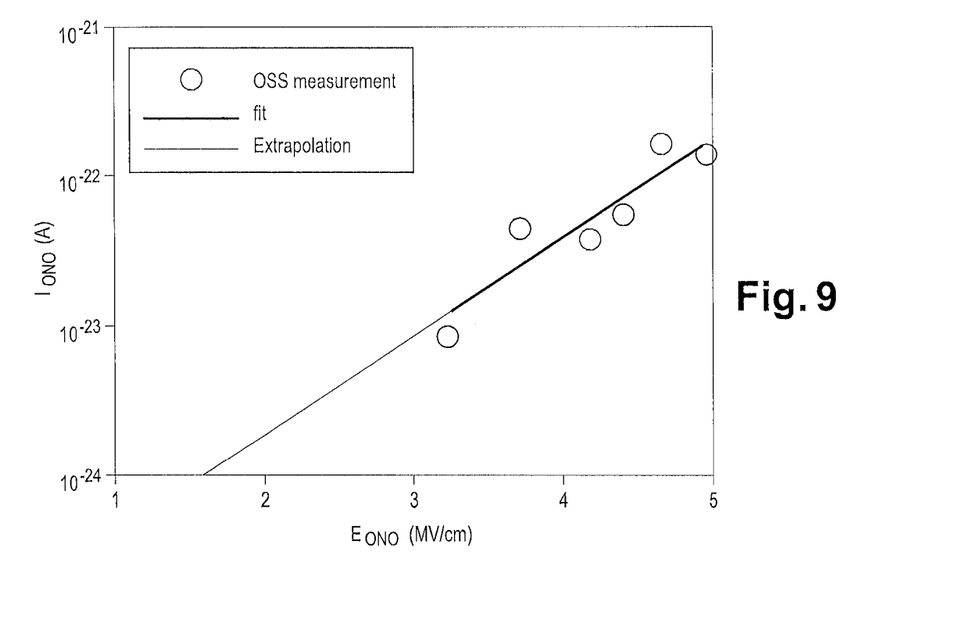
FIG. 9 represents the measured leakage current of the flash memory cell in function of the electric field in the inter-gate structure.

For each curve of FIG. 8, the slope $A_2$ of the linear component is extracted in order to calculate the corresponding ONO leakage current $I_{ONO}$. Finally, the results may be plotted in the form of a leakage current $I_{ONO}$-electric field $E_{ONO}$ curve, as shown on FIG. 9. By extrapolating this $I_{ONO}$-$E_{ONO}$ curve at lower electric field, the leakage currents at the data retention condition may be estimated.

It has thus been disclosed a new method for measuring the low-field (1-5 mV/cm) leakage current through the inter-gate dielectric structure of flash memory cells. Leakage currents on the order of $10^{-22}$ to $10^{-23}$ have been extracted from Oxide Stress Separation measurement based on the sensitivity of the flash cell's threshold voltage to the charge on its floating gate. This method therefore extends the limits of the inter-gate leakage currents measurement, both in terms of current sensibility and of inter-gate electrics fields, compared to the measurement on large-area test structures.

This method allows for the evaluation of low-field leakage currents on nominal flash cell and may be applied to determine the contribution of inter-gate leakage to the data retention properties.

The method for measuring the low-field leakage current according to an embodiment of the invention may be implemented by a computer program implemented on a non-transitory physical machine readable medium (e.g. a memory). This computer program comprises machine-executable instructions in order to implement the steps S1-S5 (or a portion of the steps S1-S5). The machine readable medium is coded with the machine-executable instructions. The computer may comprises at least one interface, one processor and a non-transient physical memory, also designated generally as being a non-transient computer-readable support or a non-transient storage memory. The computer may be a personal computer, given that it is programmed to execute the specific steps of the method described in the present document. The non-transient memory is encoded or programmed with specific instruction code in order to implement the method described in this document and the steps that are associated with it. The non-transient memory communicates with the physical processor in such a way that the physical processor, when it is used, reads and executes the specific instruction codes which are integrated into the non-transient memory. The interface of the personal computer communicates with the physical processor and receives input parameters which are processed by the physical processor.

Having described and shown the principles of the invention and by referring to the various embodiments, it appears that the various embodiments can be modified in their arrangement and in their details without moving away from the principles of the invention. In particular, the method for determining the leakage current is both applicable to single-level cell (SLC) flash memory (wherein each cell stores a single bit of information), and to multi-level cell (MLC) flash memory (wherein each cell stores more than one bit of information). The method is also applicable to inter-gate structure other than the silicon oxide-silicon nitride-silicon oxide (ONO) stack, Any dielectric layer or stack would work, for example the Oxide/Alumina/Oxide stack, the HfAlO/Al$_2$O$_3$/HfAlO stack . . . .

The invention claimed is:

1. A method for determining a leakage current through an inter-gate dielectric structure of a flash memory cell, the flash memory cell comprising:
   a substrate comprising a channel region;
   a floating gate positioned above the channel region and separated from the channel region by a tunnel dielectric layer;
   a control gate positioned above the floating gate and separated from the floating gate by the inter-gate dielectric structure;
said method comprising:
   programming the flash memory cell into an initial programmed state and applying biasing conditions to the programmed flash memory cell so as to obtain a zero electric field in the tunnel dielectric layer;
   measuring over time a change in a threshold voltage of the flash memory cell; and
   determining the leakage current from the change in the threshold voltage.

2. The method according to claim 1, comprising:
   determining a flat-band voltage of a tunnel capacitor comprising the channel region, the tunnel dielectric layer and the floating gate, said flat-band voltage implying the zero electric field in the tunnel dielectric layer;
   determining the initial programmed state and a corresponding control gate bias that lead to a voltage between the floating gate and the channel region equal to the determined flat-band voltage, given a desired electric field in the inter-gate dielectric structure;
   programming the flash memory cell in the initial programmed state;
   applying the corresponding control gate bias and read intermittently the programmed flash memory cell so as to obtain a plurality of threshold voltage values of the flash memory cell;
   determining the leakage current from the plurality of threshold voltage values.

3. The method according to claim 2, wherein the flat-band voltage of the tunnel capacitor is determined from a C-V measurement of a capacitive test structure of identical construction but larger area than the tunnel capacitor.

4. The method according to claim 2, wherein the initial programmed state ($V_t^{OSS}$) of the flash memory cell and the corresponding control gate bias ($V_{CG}^{OSS}$) are determined by solving the following equations:

$$V_t^{OSS} = V_{CG}^{OSS} + V_{t_o} - \frac{V_{FB}}{\alpha_{CG}}$$

$$V_{CG} = E_{ONO} \times EOT_{ONO} + V_{FB}$$

where $E_{ONO}$ is the desired electric field in the inter-gate dielectric structure, $V_{FB}$ is the determined flat-band voltage, $EOT_{ONO}$ is an equivalent oxide thickness of the inter-gate dielectric structure, $V_{t_0}$ is a neutral threshold voltage of the flash memory cell, when the floating gate is empty of charge, and $\alpha_{CG}$ is a coupling factor between the control gate and the floating gate.

5. The method according to claim 4, further comprising determining the neutral threshold voltage ($V_{t_0}$) and the coupling factor ($\alpha_{CG}$) from a drain current-control gate potential ($I_D$-$V_{CG}$) measurement of the flash memory cell and from a drain current-gate potential ($I_D$-$V_{CG}$) measurement of a transistor equivalent to the flash memory cell.

6. The method according to claim 5, wherein the transistor equivalent to the flash memory cell is comprised of a test memory cell, of identical geometry to the flash memory cell, having a floating gate and a control gate in short-circuit.

7. The method according to claim 2, wherein the leakage current is determined by fitting the plurality of threshold voltage values ($V_{t_i}$) with the following relationship:

$$V_t(t) = A_0 * e^{-t/\tau} + A_1 + A_2 * t$$

where $A_0$, $A_1$, $A_2$ are fitting constants, r is a charge trapped-related factor and t is a time during which the control gate bias ($V_{CG}^{OSS}$) is applied.

8. A non-transitory machine readable medium comprising a computer program product comprising instructions for implementing the method according to claim 1, when executed by a processor.

* * * * *